United States Patent [19]

Maeda et al.

[11] Patent Number: 5,140,706
[45] Date of Patent: Aug. 18, 1992

[54] TRANSMISSION-LINE TRANSFORMER DEVICE FOR DOUBLE-BALANCED MINER

[75] Inventors: Youji Maeda; Wataru Takegawa; Yoshikuni Higashikawa; Akimasa Matsushima, all of Nagaokakyo, Japan

[73] Assignee: Murata Manufacturing Co., Ltd., Nagaokakyo, Japan

[21] Appl. No.: 491,424

[22] Filed: Mar. 9, 1990

[30] Foreign Application Priority Data

Mar. 9, 1989 [JP] Japan ................. 1-26820[U]

[51] Int. Cl.⁵ .................. H04B 1/26; H01F 15/02
[52] U.S. Cl. ........................ 455/326; 336/65; 336/192; 336/229
[58] Field of Search .......... 336/65, 192, 229, 92; 455/326

[56] References Cited

U.S. PATENT DOCUMENTS

| 2,869,089 | 1/1959 | Hampel | 336/65 |
|---|---|---|---|
| 2,953,758 | 9/1960 | Stanwyck | 336/65 |
| 2,962,678 | 11/1960 | Gellert et al. | 336/65 |
| 2,983,886 | 5/1961 | Heckler, Jr. | 336/65 |
| 3,246,272 | 4/1966 | Wiley | 336/229 X |
| 3,443,257 | 5/1969 | Mollman | 336/65 |
| 3,493,908 | 2/1970 | Byers et al. | 336/65 |
| 4,623,865 | 11/1986 | Kiesel et al. | 336/229 X |
| 4,748,405 | 5/1988 | Brodzik et al. | 336/65 X |
| 4,769,625 | 9/1988 | Meindl | 336/65 |

FOREIGN PATENT DOCUMENTS

| 60-208807 | 10/1985 | Japan | 336/65 |
|---|---|---|---|
| 60-208808 | 10/1985 | Japan | 336/65 |
| 63-65605 | 3/1988 | Japan | 336/65 |

Primary Examiner—Thomas J. Kozma
Attorney, Agent, or Firm—Wenderoth, Lind & Ponack

[57] ABSTRACT

A transformer device of a double-balanced mixer includes a rectangular seat member and first and second transformers aligned side by side in a lengthwise direction on a top surface of the seat member. Support members project from the top surface of the seat member to position and secure the first and second transformers along the top surface. A plurality of pin terminals extend from a bottom surface of a seat member and are adapted to project through through-holes provided in a circuit board of the double-balanced mixer. Input and output wires of the first and second transformers respectively extend along recesses formed in the sides of the seat member for coupling to the pin terminals.

10 Claims, 2 Drawing Sheets

TRANSMISSION-LINE TRANSFORMER DEVICE FOR DOUBLE-BALANCED MIXER

BACKGROUND OF THE INVENTION

1. Field of the Invention

This invention relates to a transmission-line transformer having a seat member, and to a double-balanced mixer employing such a transformer primarily for use in a CATV tuner.

2. Description of the Related Art

Since the double-balanced mixer used in an up-down-converter for a CATV tuner must maintain characteristics thereof over a wide band, several transmission-line transformers are generally used therein.

One example of such a double-balanced mixer is shown in FIG. 2 wherein four diodes 11~14 are connected effectively in a bridge arrangement between a transmission-line transformer 22 and LC phase distributors 31, 32. Numerals 21, 23 designate input/output transmission-line transformers which are generally disposed as shown.

By means of transmission-line transformer 22, diodes 11~14 and phase distributors 31, 32, the high-frequency signal RF transmitted to terminal 41 is subject to frequency conversion based on local oscillating signals LO transmitted to terminal 42, and output to terminal 43 is the intermediate-frequency signal IF.

FIG. 3(A) and FIG. 3(B) show conventional structures for the transmission-line transformers and for the double-balanced mixer employing such transformers.

Conventional transmission-line transformers have a construction in which a plurality of thin windings 52 are wound around annular cores 51 to form transmission-line transformers 50a~50c.

In the conventional double-balanced mixer, the transmission-line transformers 50a-50c are mounted on a circuit board 2 (for example, a printed substrate), and lead portions 53 of each winding 52 are passed through holes 3 formed in the circuit board 2 to be soldered to an electrode pattern (not shown) which is disposed on the reverse side of the circuit board 2, thereby fixing and electrically connecting each of transmission-line transformers 50a~50c.

In the double-balanced mixer described above which employs the conventional transmission-line transformers 50a ~50c, a thin wire is used for the windings 52 whereby a problem occurs in that, when each of the transmission-line transformers 50a~50c is fixed to the circuit board 2, each lead portion 53 of the windings 52 must manually be passed through each hole 3 in the circuit board 2 using a pair of tweezers, thereby requiring much assembling time.

Another problem is also posed in that each of transmission-line transformers 50a~50c on the circuit board 2 fluctuates in position, and the lead portions 53 thereof also fluctuate in length and position, thus causing considerable variation in the double-balanced mixer characteristics after assembling thereof. Such variations in turn necessitate minute characteristic adjustments by altering intervals between the windings 52 and the like.

SUMMARY OF THE INVENTION

Accordingly, it is a first object of the present invention to provide a transmission-line transformer having a seat member which is capable of being easily fixed to a circuit board.

It is a second object of the present invention to provide a transmission-line transformer having reduced characteristic fluctuations after assembly of the double-balanced mixer and also which is capable of simplifying or omitting minute characteristic adjustments after assembly of the same.

It is a third object of the present invention to provide a double-balanced mixer for significantly reducing assembly time and for stabilizing the characteristics thereof.

In order to attain the objects described above, the transmission-line transformer according to a first embodiment includes a seat member having a positioning support and a plurality of pin terminals projecting from a reverse surface thereof. A transmission-line transformer formed of an annular core and a plurality of windings is positioned and supported by the seat member, and lead portions of the plurality of windings are connected to corresponding pin terminals.

Likewise, according to a second embodiment of the invention, the transmission-line transformer having a seat member in the first embodiment as described above is used as a transmission-line transformer of a double-balanced mixer.

DESCRIPTION OF THE PREFERRED EMBODIMENTS

The transmission-line transformer device of the present invention is fixed to a circuit board by passing terminals thereof through holes provided in the circuit board, thus facilitating securing the transformer to the circuit board and reducing the time required for assembling the double-balanced mixer.

In addition, since the transmission-line transformer is positioned and supported on a seat member, positional fluctuations of the transformer and of the lead portions of the windings are reduced and as a result, and characteristic fluctuations of the double-balanced mixer after assembly are likewise reduced.

Figure 3A:
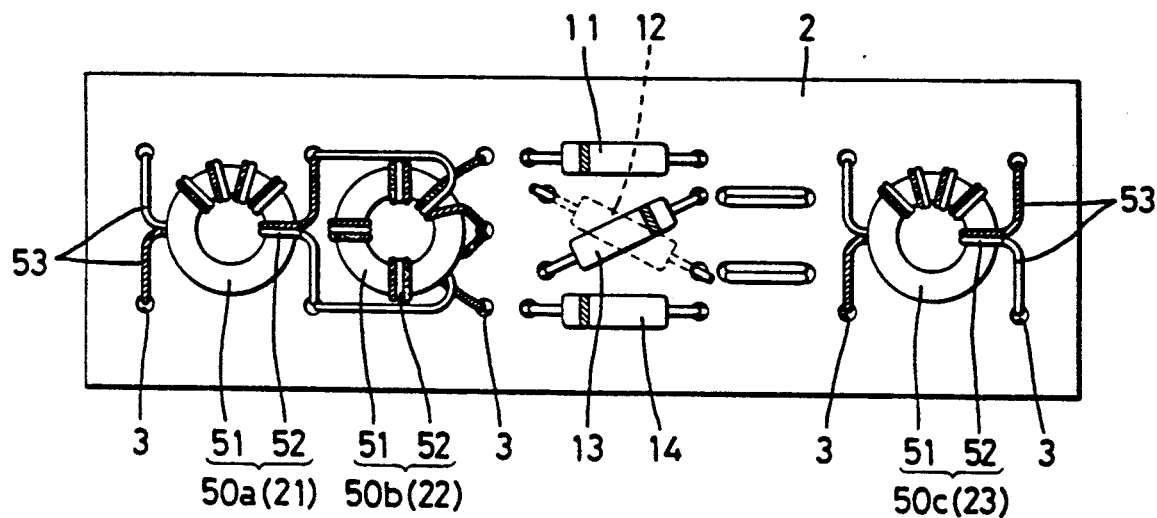
FIG. 3(A) is a plan view of the conventional double-balanced mixer.
Figure 3B:
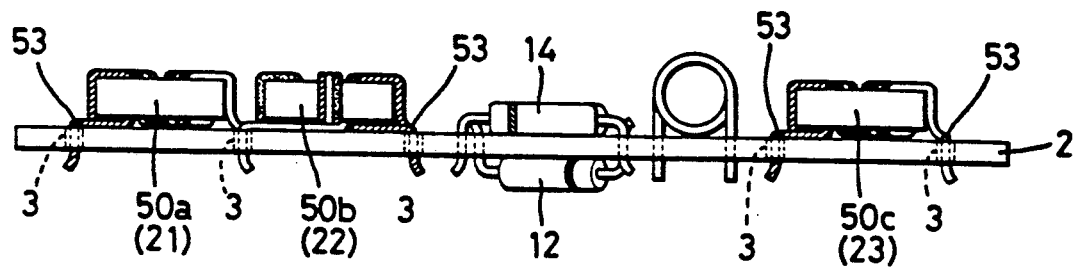
FIG. 3(B) is a side elevation view thereof.

FIG. 1 depicts the transmission-line transformer and the double-balanced mixer employing the same according to the present invention, in which the same parts or portions as are equivalent to the conventional example shown in FIG. 3 are designated by the same reference numerals. A detailed explanation of such parts or portions is omitted below.

Figure 1A:
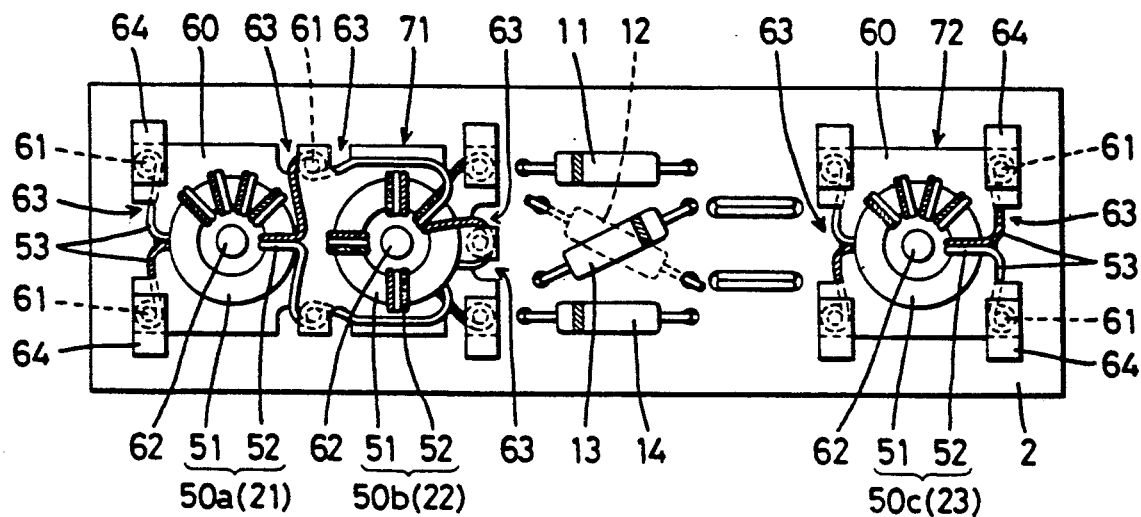
FIG. 1(A) is a plan view of a transformer and double-balanced mixer according to the present invention.
Figure 1B:
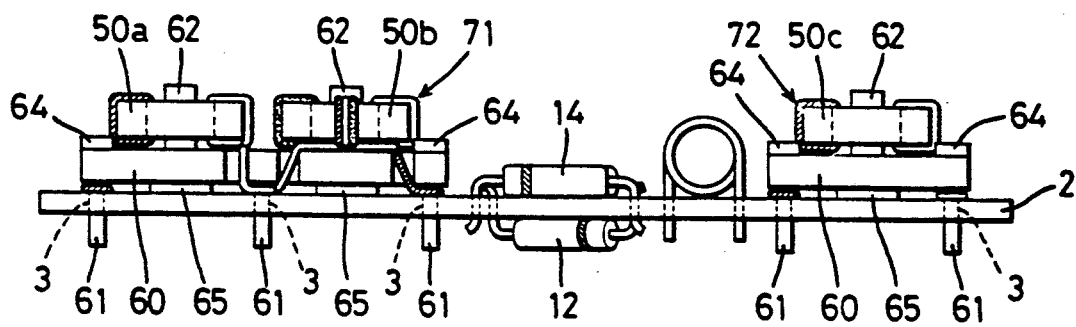
FIG. 1(B) is a side elevation view thereof.
Figure 2:
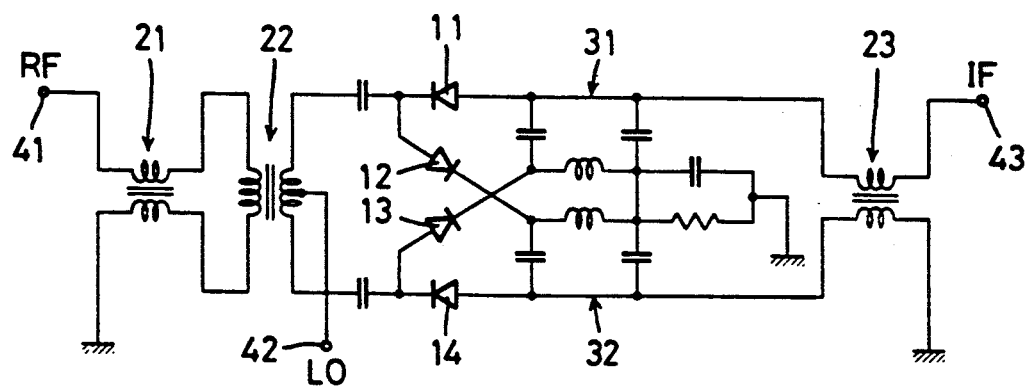
FIG. 2 is a circuit diagram of a double-balanced mixer for use in a CATV tuner.

In FIG. 1, the transmission-line transformer device 71 is used as transmission-line transformers 21, 22 shown in FIG. 2 and the transmission-line transformer device 72 as the transmission-line transformer 23 shown in FIG. 2.

The transmission-line transformer device 71 includes two transmission-line transformers 50a, 50b which are each formed of a plurality of windings 52 wound around an annular core 51, similar to those described above, and which are mounted on a seat member 60. The seat member 60 is made of insulating resin, for example, and includes on a surface thereof a projecting positioning support 62 and on a reverse surface thereof a plurality of projecting pin terminals 61 (in the example, seven terminals are provided).

The supports 62 project through the central holes of the annular cores 51 to thereby position the transformers 50a, 50b on the seat member 60, and the lead portions 53 of each winding 52 extend along the side portion of the seat member 60 to the reverse thereof so as to be connected by soldering, for example, to the base portions of the pin terminals 61, respectively.

When the two transmission-line transformers 50a, 50b are assembled in advance as a single transmission-line transformer device 71, the assembly time thereof to the circuit board 2 can be reduced (to half). However, the transformers 50a, 50b may naturally be provided with separate seat members.

The transmission-line transformer device 72 is constructed substantially in the same way as the transmission-line transformer device 71 described above except that the latter includes only one transmission-line transformer 50c.

The transmission-line transformer devices 71, 72 are fixed to the circuit board 2 together with other parts. The pin terminals 61 of the transformer devices 71, 72 are passed through respective holes 3 in the circuit board 2 to be soldered at a reverse side of the circuit board to an electrode pattern (not shown), thus constructing the double-balanced mixer having the circuit configuration shown in FIG. 2.

In the double-balanced mixer as above, transmission-line transformer devices 71, 72 are fixed by inserting at one time the pin terminals 61 thereof through holes 3 of the circuit board 2, whereby fixing of transformers can be conducted in a relatively simple manner compared with the conventional method (in which the thin lead portions 53 are inserted manually through the holes 3 of the board 2 using a pair of tweezers), thus significantly reducing the time required for assembly of the double-balanced mixer.

Moreover, the transmission-line transformer devices 71, 72 may be mounted in the same way as other parts by an automatic machine, thus further enabling a reduced assembly time.

Furthermore, in the above-described transmission-line transformer devices 71, 72, the transformers 50a~50c are positioned by the supports 62 and mounted on the seats members 60 to thereby reduce positional fluctuations of the transformers 50a~50c and the lead portions 52 of the windings 52, whereby characteristic fluctuations after assembling the double-balanced mixer, especially intermodulation distortion, can be reduced. Accordingly, minute adjustments after assembly can be simplified or omitted.

The transmission-line transformers 50a~50c in the above-described transmission-line transformer devices 71, 72 may be securely fixed on the seat members 60 by an adhesive in addition to positioning thereof by the supports 62.

As shown in FIG. 1(A), recesses 63 may be formed along a side portion of seat member 60 to permit the lead portions 53 of transmission-line transformers 50a~50c to be connected to the corresponding pin terminals 61 in the shortest possible distance, whereby the lead portions 53 may extend within the recesses 63 to the reverse side of the seat member 60. As such, the length and position of the lead portions 53 varies less, thus reducing characteristic fluctuations.

Also, as shown in FIG. 1(B), the seat member 60 of the transmission-line transformer devices 71, 72 may be provided at the reverse surface thereof with a projecting portion 65 (which is square in shape, for example) projecting a distance which is a little more than a height of a base portion of pin terminal 61 (portion to be soldered) around which the lead portion 53 is wound. In the absence of such a projecting portion 65, there is a possibility that the transmission-line transformer devices 71, 72 may be unstable on the circuit board 2 when the soldered portions at the base of the pin terminals 61 do not have a uniform length. The projecting portion 65 abuts against the surface of the circuit board 2 to thereby stabilize the transformer devices 71, 72 so that characteristic fluctuations thereof are reduced to that extent.

In addition, as shown in FIGS. 1(A) and 1(B), projecting pieces 64 may extend from the four corners of the seat member 60 of the transmission-line transformer devices 71, 72. As such, the transformer devices 71, 72 may be engaged using the projecting pieces 64 on the rail of an automatic machine and transferred for assembly on the circuit board 2.

The support 62 for positioning the transmission-line transformers 50a-50c on the seat member 60 need not be of the type shown above in which the support is inserted through a central hole of the core 51, but may instead be of a type which projects around the periphery of the core 51. In this case, by providing a plurality of supports (preferably 3~4 supports) at the periphery of the core 51, the transformers 50a-50c are prevented from moving.

Also, the circuit in the double-balanced mixer to which this device is applied is not limited to one shown in FIG. 2, but instead any circuit will suffice in which the transmission-line transformer is used.

Accordingly, it is not always necessary to dispose diodes as shown in FIG. 2.

As described above, according to the present invention, a seat member is provided having a support projecting from one surface and pin terminals projecting from a reverse surface thereof. An annular core of a transformer is positioned by the support and lead portions of a winding wound around the core are connected to the corresponding pin terminals to thereby obtain a transmission-line transformer device in which positional fluctuations of the transmission-line transformer and the lead portions of the winding are reduced, thus further reducing characteristic fluctuations after assembling of the double-balanced mixer. Accordingly, minute adjustments after assembly that has conventionally been required can now be simplified.

Since, in the double-balanced mixer, transmission-line transformer devices are used, fixing thereof to the circuit board becomes simple. As a result, the time required for assembling the double-balanced mixer is significantly reduced as compared with the conventional example.

What is claimed is:
1. A transformer device comprising:
   a seat member having a top surface and a bottom surface, said seat member being generally rectangular and having first and second corner portions at one end thereof and third and fourth corner portions at another end thereof, said first and third corner portions located at opposite ends of a same first side of said seat member, and said second and fourth corner portions located at opposite ends of a same second side of said seat member;

first and second transformers aligned side by side in a lengthwise direction of seat member on said top surface of said seat member, said first transformer having first and second input wires and first and second output wires, said second transformer having first and second input wires and first and second output wires and a local oscillation source input wire;

support members projecting from said top surface of said seat member for positioning and securing said first and second transformers along said top surface of said seat member;

first, second, third and fourth pin terminals extending from said bottom surface of said seat member at said first, second, third and fourth corner portions, respectively; and, a fifth pin terminal extending from said bottom surface of said seat member adjacent said first side of said seat member and located substantially halfway between said first and third corner portions;

a sixth pin terminal extending from said bottom surface of said seat member adjacent said second side of said seat member and located substantially halfway between said second and fourth corner portions; and, a seventh pin terminal extending from said bottom surface of said seat member adjacent said another end of said seat member and located substantially halfway between said third and fourth corner portions;

wherein said firs and second input wires of said first transformer are respectively connected to said first and second pin terminals;

wherein said first and second output wires of said first transformer are respectively connected to said fifth and sixth pin terminals;

wherein said first and second input wires of said second transformer are respectively connected to said fifth and sixth pin terminals;

wherein said first and second output wires of said second transformer are connected to said third and fourth pin terminals, respectively; and, wherein said local oscillation source input wire of said second transformer is connected to said seventh pin terminal.

2. A transformer device as recited in claim 1, further comprising at least one projecting member extending from said bottom surface of said seat member, said at least one projecting member extending a distance which is greater than a base portion of each of said first through seventh pin terminals around which a respective wire is wound.

3. A transformer device as recited in claim 1, wherein said seat member includes a plurality of recesses formed in said ends and sides thereof, and wherein said input and output wires of said first and second transformers and said local oscillation source input wire of said second transformer respectively extend within said plurality of recesses from said top surface to said bottom surface of said seat member.

4. A transformer device as recited in claim 2, wherein said seat member includes a plurality of recesses formed in said ends and sides thereof, and wherein said input and output wires of said first and second transformers and said local oscillation source input wire of said second transformer respectively extend within said plurality of recesses from said top surface to said bottom surface of said seat member.

5. A transformer device as recited in claim 1, further comprising first, second, third and fourth projecting pieces extending from said top surface of said seat member at said first, second, third and fourth corner portions, respectively.

6. A double-balanced mixer comprising:
a circuit board; and,
a first transformer device, a phase distributor pair and a second transformer device successively aligned in a lengthwise direction on said printed circuit board;
said first transformer device comprising:
(a) a first seat member having a top surface and a bottom surface, said first seat member being generally rectangular and having first and second corner portions at one end thereof and third and fourth corner portions at another end thereof, said first and third corner portions located at opposite ends of a same first side of said first seat member, and said second and fourth corner portions located at opposite ends of a same second side of said first seat member;
(b) first and second transformers aligned side by side in the lengthwise direction on said top surface of said first seat member, aid first transformer having first and second input wires and first and second output wires, said second transformer having first and second input wires and first and second output wires and a local oscillation source input wire;
(c) support members projecting from said top surface of aid first seat member for positioning and securing said first and second transformers along said top surface of aid first seat member;
(d) first, second, third and fourth pin terminals extending from said bottom surface of said first seat member at said first, second, third and fourth corner portions, respectively; and,
(e) a fifth pin terminal extending from said bottom surface of said first seat member adjacent said first side of said first seat member and located substantially halfway between said first and third corner portions;
(f) a sixth pin terminal extending from said bottom surface of said first seat member adjacent said second side of said first seat member and located substantially halfway between said second and fourth corner portions; and,
(g) a seventh pin terminal extending from said bottom surface of said first seat member adjacent said another end of said first seat member and located substantially halfway between said third and fourth corner portions; wherein said first and second input wires of said first transformer are respectively connected to said first and second pin terminals of aid first seat member; wherein said first and second output wires of said first transformer are respectively connected to said fifth and sixth pin terminals of said first seat member; wherein said first and second input wires of said second transformer are respectively connected to said fifth and sixth pin terminals of said first seat member; wherein said first and second output wires of said second transformer are connected to said third and fourth pin terminals, respectively of said first seat member; and, wherein said local oscillation source input wire of said second transformer is connected to said seventh pin terminal of said first seat member;
said second transformer device comprising:

(a) a second seat member having a top surface and a bottom surface, first and second corner portions at one end thereof and third and fourth corner portions at another end thereof, said first and third corner portions located at opposite ends of a same first side of said second seat member, and said second and fourth corner portions located at opposite ends of a same second side of said second seat member;

(b) a third transformer located on said top surface of said second seat member, said third transformer having first and second input wires and first and second output wires;

(c) at least one support member projecting from said top surface of said second seat member for positioning and securing said third transformer along said top surface of said second seat member; and, (d) first, second, third and fourth pin terminals extending from said bottom surface of said second seat member at said first, second, third and fourth corner portions, respectively; wherein said first and second input wires of said third transformer are respectively connected to said first and second pin terminals of said second seat member; and wherein said first and second output wires of said third transformer are respectively connected to said third and fourth pin terminals of said second seat member.

7. A double-balanced mixer as recited in claim 6, further comprising at least one projecting member extending from said bottom surface of said first seat member, said at least one projecting ember extending a distance which is greater than a base portion of each of said first through seventh pin terminals of said first seat member around which a respective wire is wound.

8. A double-balanced mixer as recited in claim 6, wherein said first seat member includes a plurality of recesses formed in said ends and sides thereof, and wherein said input and output wires of said firs and second transformers and said local oscillation source input wire of said second transformer respectively extend within said plurality of recesses from said top surface to said bottom surface of said first seat member.

9. A double-balanced mixer as recited in claim 7, wherein said first seat member includes a plurality of recesses formed in said ends and sides thereof, and wherein said input and output wires of said first and second transformers and said local oscillation source input wire of said second transformer respectively extend within said plurality of recesses from said top surface to said bottom surface of said first seat member.

10. A double-balanced mixer as recited in claim 6, further comprising first, second, third and fourth projecting pieces extending from said top surface of said first seat member at said first, second, third and fourth corner portions of said first seat member, respectively.

* * * * *

UNITED STATES PATENT AND TRADEMARK OFFICE
CERTIFICATE OF CORRECTION

PATENT NO. : 5,140,706
DATED : August 18, 1992
INVENTOR(S) : MAEDA et al.

It is certified that error appears in the above-identified patent and that said Letters Patent is hereby corrected as shown below:

On title page, item [54], line 2, and col. 1, line 2, change "MINER" to --MIXER--.

Signed and Sealed this

Fifth Day of October, 1993

Attest:

BRUCE LEHMAN

*Attesting Officer*  *Commissioner of Patents and Trademarks*